United States Patent
Yahata et al.

(10) Patent No.: US 11,990,347 B2
(45) Date of Patent: May 21, 2024

(54) METHOD OF MANUFACTURING SEMICONDUCTOR DEVICE

(71) Applicant: KOKUSAI ELECTRIC CORPORATION, Tokyo (JP)

(72) Inventors: Takashi Yahata, Toyama (JP); Toshiyuki Kikuchi, Toyama (JP)

(73) Assignee: KOKUSAI ELECTRIC CORPORATION, Tokyo (JP)

( * ) Notice: Subject to any disclaimer, the term of this patent is extended or adjusted under 35 U.S.C. 154(b) by 345 days.

(21) Appl. No.: 17/142,140

(22) Filed: Jan. 5, 2021

(65) Prior Publication Data
US 2021/0210356 A1 Jul. 8, 2021

(30) Foreign Application Priority Data
Jan. 6, 2020 (JP) .................................. 2020-000232

(51) Int. Cl.
*H01L 21/324* (2006.01)
*H01L 21/02* (2006.01)
*H01L 21/67* (2006.01)

(52) U.S. Cl.
CPC ...... *H01L 21/324* (2013.01); *H01L 21/02057* (2013.01); *H01L 21/02063* (2013.01); *H01L 21/67115* (2013.01)

(58) Field of Classification Search
CPC ............ H01L 21/324; H01L 21/02057; H01L 21/02041; H01L 21/02043; H01L 21/02063; H01L 21/02071; H01L 21/67115; H01L 21/67098; H01L 21/67028; H01L 21/68742;
(Continued)

(56) References Cited

U.S. PATENT DOCUMENTS

| 5,183,775 A * | 2/1993 | Levy ................. H01L 21/31662 |
| | | 438/386 |
| 9,640,385 B2 * | 5/2017 | Citla ................. H01L 21/28035 |
| 11,473,196 B2 * | 10/2022 | Ohashi ............. H01L 21/68771 |

(Continued)

FOREIGN PATENT DOCUMENTS

| JP | 2003-077901 A | 3/2003 |
| JP | 2013-110418 A | 6/2013 |

(Continued)

OTHER PUBLICATIONS

Japanese Office Action dated Apr. 27, 2021 for Japanese Patent Application No. 2020-000232.

*Primary Examiner* — Mary A Wilczewski
(74) *Attorney, Agent, or Firm* — Volpe Koenig (57) ABSTRACT

Described herein is a technique capable of forming a film whose characteristics are uniform by discharging a residual component from a plurality of grooves before supplying a process gas. According to one aspect thereof, there is provided a substrate processing apparatus including: (a) loading a substrate on which a plurality of grooves are provided into a process chamber, wherein a residue is adhered to the plurality of the grooves; (b) desorbing the residue from the plurality of the grooves by heating the substrate; and (c) discharging the residue from the plurality of the grooves to a process space of the process chamber after (b) is performed by heating a surface of the substrate to a temperature higher than a temperature of the substrate in (b).

14 Claims, 8 Drawing Sheets

(58) Field of Classification Search
CPC ......... H01L 21/31116; H01L 21/32135; H01L 21/02104
See application file for complete search history.

(56) References Cited

U.S. PATENT DOCUMENTS

| | | | | |
|---|---|---|---|---|
| 11,476,112 | B2* | 10/2022 | Tanaka | H01L 21/67253 |
| 2001/0053585 | A1* | 12/2001 | Kikuchi | H01L 21/02049 |
| | | | | 257/E21.252 |
| 2008/0060676 | A1* | 3/2008 | Scranton | B08B 3/10 |
| | | | | 134/2 |
| 2008/0305644 | A1* | 12/2008 | Noda | H01L 21/76232 |
| | | | | 438/733 |
| 2009/0117736 | A1* | 5/2009 | Mebarki | H01L 21/76814 |
| | | | | 438/680 |
| 2017/0372894 | A1* | 12/2017 | Aburatani | H01L 21/02189 |
| 2019/0081238 | A1* | 3/2019 | Kitamura | C23C 16/00 |
| 2019/0164789 | A1 | 5/2019 | Aoyama et al. | |
| 2019/0279877 | A1 | 9/2019 | Murakami et al. | |
| 2020/0090930 | A1* | 3/2020 | Hashimoto | C23C 16/45546 |
| 2020/0098586 | A1* | 3/2020 | Xia | H01J 37/32724 |
| 2020/0258747 | A1* | 8/2020 | Narushima | C23C 16/06 |
| 2021/0151326 | A1 | 5/2021 | Shimizu et al. | |
| 2021/0210356 | A1* | 7/2021 | Yahata | H01L 21/324 |
| 2021/0296111 | A1* | 9/2021 | Yahata | H01L 21/0217 |
| 2022/0230870 | A1* | 7/2022 | Hashimoto | H01L 21/02123 |
| 2022/0246422 | A1* | 8/2022 | Hashimoto | H01L 21/0228 |
| 2022/0246440 | A1* | 8/2022 | Kumakura | H01L 21/31116 |

FOREIGN PATENT DOCUMENTS

| | | | | |
|---|---|---|---|---|
| JP | 2018-018847 A | | 2/2018 | |
| JP | 2019-012759 A | | 1/2019 | |
| JP | 2019-160962 A | | 9/2019 | |
| JP | 2021-9980 | * | 1/2021 | ............ H01L 21/31 |
| JP | 2022-132676 | * | 9/2022 | ............ H01L 21/31 |
| WO | WO 2018/013896 | * | 1/2018 | ........... H01L 21/324 |
| WO | WO 2021/009838 | * | 1/2021 | ............ H01L 21/31 |
| WO | WO 2021/021486 | * | 2/2021 | ............ H01L 43/12 |
| WO | WO 2022/196339 | * | 9/2022 | ............ H01L 21/31 |

* cited by examiner

METHOD OF MANUFACTURING SEMICONDUCTOR DEVICE

CROSS-REFERENCE TO RELATED PATENT APPLICATION

This non-provisional U.S. patent application claims priority under 35 U.S.C. § 119 of Japanese Patent Application No. 2020-000232, filed on Jan. 6, 2020, in the Japanese Patent Office, the entire contents of which are hereby incorporated by reference.

FIELD

The present disclosure relates to a method of manufacturing a semiconductor device.

DESCRIPTION OF THE RELATED ART

In general, a manufacturing process of a semiconductor device includes a plurality of processes such as forming various films on a substrate (also referred to as a "wafer") and processing the substrate (or a film formed on the substrate).

Recently, as a structure of the semiconductor device is integrated at a high density, a plurality of grooves (hereinafter, also simply referred to as grooves) whose aspect ratio is high should be formed in the film on the wafer. In general, the grooves may be formed by an etching process. After the etching process is performed, a cleaning process is performed to remove a residue in the grooves. After the cleaning process is performed, the next process, for example, a film-forming process of forming a film in the grooves is performed. For example, according to some related arts, a film-forming technique of forming the film in the grooves whose aspect ratio is high is disclosed.

The characteristics of the film formed on surfaces of the grooves whose aspect ratio is high should be maintained uniform from the bottom to the top of each of the grooves. For example, a thickness of the film or a quality of the film should be uniform from the bottom to the top of each of the grooves.

In order to process the surfaces of the grooves whose aspect ratio is high, a process gas may be supplied into the grooves in some cases. However, a process such as the etching process and the cleaning process may be performed before supplying the process gas into the grooves. As a result, components such as a cleaning liquid used in the processes described above may remain in the grooves. In this case, the film whose characteristics are uniform may not be formed.

SUMMARY

Described herein is a technique capable of forming a film whose characteristics are uniform by discharging a residual component from a plurality of grooves before supplying a process gas.

According to one aspect of the technique of the present disclosure, there is provided a processing apparatus including: (a) loading a substrate on which a plurality of grooves are provided into a process chamber, wherein a residue is adhered to the plurality of the grooves; (b) desorbing the residue from the plurality of the grooves by heating the substrate; and (c) discharging the residue from the plurality of the grooves to a process space of the process chamber after (b) is performed by heating a surface of the substrate to a temperature higher than a temperature of the substrate in (b).

DETAILED DESCRIPTION

Hereinafter, one or more embodiments (also simply referred to as "embodiments") according to the technique of the present disclosure will be described with reference to the drawings.

(1) Configuration of Substrate Processing Apparatus

Hereinafter, a configuration of a substrate processing apparatus preferably used in the embodiments will be described.

<Substrate Processing Apparatus>

Figure 1:
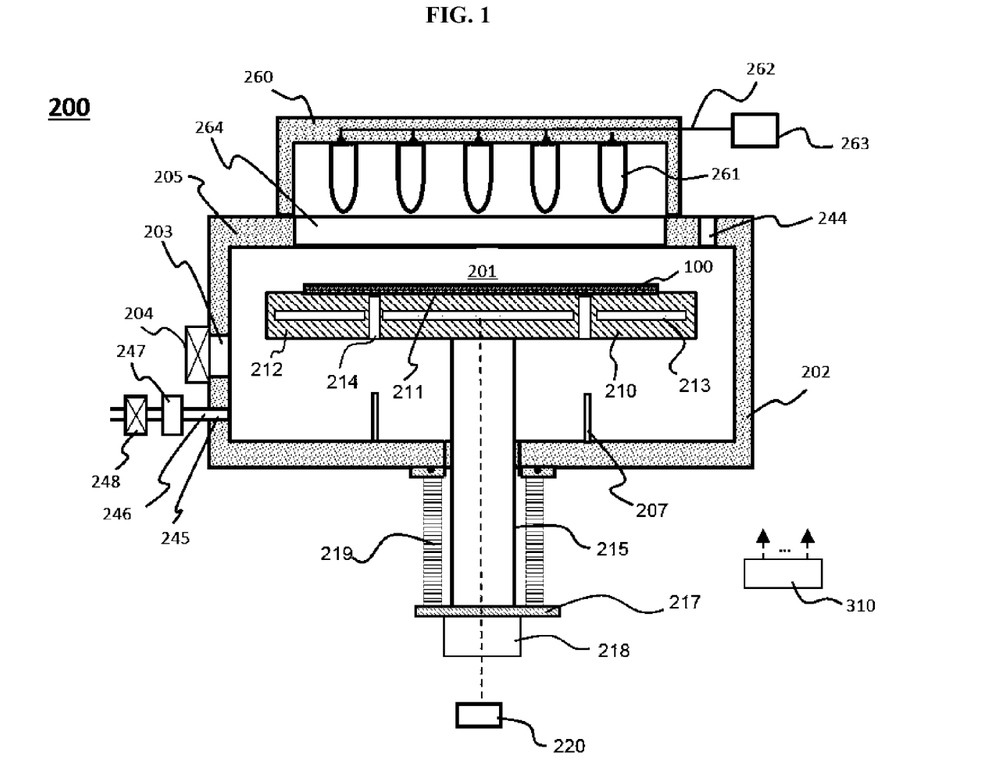
FIG. 1 schematically illustrates a vertical cross-section of a substrate processing apparatus preferably used in one or more embodiments described herein.

As shown in FIG. 1, a substrate processing apparatus 200 preferably used in the embodiments includes a process vessel 202. For example, the process vessel 202 is a flat and sealed vessel whose horizontal cross-section is circular. A side wall or a bottom wall of the process vessel 202 is made of a metal material such as aluminum (Al) and stainless steel (SUS).

A space surrounded by the process vessel 202 and a substrate mounting stage 212 described later and above a wafer (also referred to as a "substrate") 100 may also be referred to as a "process space 201". In addition, a room defining the process space 201 may also be referred to as a "process chamber 205".

A substrate loading/unloading port 203 is provided on a side surface of the process vessel 202. The substrate loading/unloading port 203 is provided adjacent to a gate valve 204. A vacuum transfer chamber (not shown) is provided at the gate valve 204 opposite to the substrate loading/unloading port 203. The wafer 100 is moved between the vacuum transfer chamber (not shown) and the process vessel 202 through the substrate loading/unloading port 203.

Lift pins 207 are provided at the bottom of the process vessel 202 constituting the substrate processing apparatus 200.

A substrate support 210 configured to support the wafer 100 is provided in the process space 201. The substrate support 210 mainly includes: the substrate mounting stage 212 having a substrate placing surface 211 on which the wafer 100 is placed; and a heater 213 serving as a heating source embedded in the substrate mounting stage 212. With such a structure, the heater 213 heats the wafer 100 through a back surface of the wafer 100. The heater 213 may also be referred to as a "first heater". Through-holes 214 penetrated by the lift pins 207 are provided at the substrate mounting stage 212 corresponding to the locations of the lift pins 207. A heater controller 220 configured to control a temperature of the heater 213 is electrically connected to the heater 213.

The substrate mounting stage 212 is supported by a shaft 215. The shaft 215 penetrates a hole provided at the bottom wall of the process vessel 202. The shaft 215 is connected to an elevator 218 outside the process vessel 202 through a support plate 217. The wafer 100 placed on the substrate placing surface 211 of the substrate mounting stage 212 may be elevated and lowered by operating the elevator 218 by elevating and lowering the shaft 215 and the substrate mounting stage 212. A bellows 219 covers a lower end portion of the shaft 215 to maintain the process vessel 202 airtight.

When the wafer 100 is transferred, the substrate mounting stage 212 is moved downward until the substrate placing surface 211 faces the substrate loading/unloading port 203 (that is, the substrate mounting stage 212 is moved to a wafer transfer position). When the wafer 100 is processed, the substrate mounting stage 212 is moved upward until the wafer 100 reaches a processing position (also referred to as a "wafer processing position") in the process space 201.

Specifically, when the substrate mounting stage 212 is lowered to the wafer transfer position, upper end portions of the lift pins 207 protrude from an upper surface of the substrate placing surface 211, and the lift pins 207 support the wafer 100 from thereunder. When the substrate mounting stage 212 is elevated to the wafer processing position, the lift pins 207 are buried from the upper surface of the substrate placing surface 211, and the substrate placing surface 211 supports the wafer 100 from thereunder.

A gas introduction port 244 is provided at an upper portion (upstream side) of the process space 201, for example, at a ceiling of the process vessel 202. A gas supplier 290 shown in FIG. 2 communicates with the gas introduction port 244.

A lamp housing 260 is provided at the ceiling of the process vessel 202 at a position facing a surface of the wafer 100. A plurality of lamps 261 are provided in the lamp housing 260. Each of the plurality of the lamps 261 is configured to heat the surface of the wafer 100. The plurality of the lamps 261 are arranged parallel to the surface of the wafer 100 to uniformly heat the surface of the wafer 100. The plurality of the lamps 261 may also be collectively referred to as a "second heater".

The plurality of the lamps 261 are connected to a lamp controller 263 via wiring 262. The lamp controller 263 is electrically connected to a controller 310 described later. According to the embodiments, the lamp controller 263 is configured to control operations of the plurality of the lamps 261 such as a turn-on operation and a turn-off operation according to an instruction from the controller 310.

A window 264 is provided at the ceiling of the process vessel 202 at a position facing the plurality of the lamps 261. The window 264 is made of a vacuum-resistant material that does not block the heat radiated from the plurality of the lamps 261. For example, the window 264 is made of quartz.

<Gas Supplier>

The gas supplier 290 shown in FIG. 2 communicating with the gas introduction port 244 will be described with reference to FIG. 2.

Figure 2:
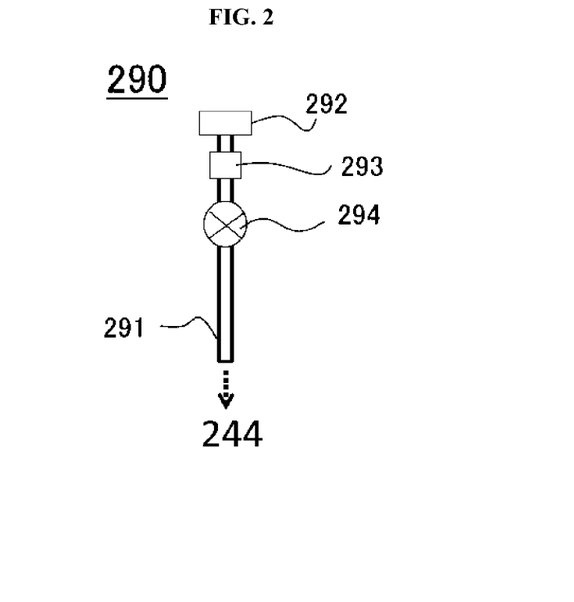
FIG. 2 schematically illustrates a gas supplier of the substrate processing apparatus preferably used in the embodiments described herein.

The gas supplier 290 shown in FIG. 2 communicates with the gas introduction port 244. The gas supplier 290 includes a gas supply pipe 291, and the gas supply pipe 291 communicates with the gas introduction port 244. A gas source 292 configured to supply a purge gas, a mass flow controller (MFC) 293 configured to adjust a flow rate of the purge gas and a valve 294 are provided at the gas supply pipe 291 in the sequential order from an upstream side to a downstream side of the gas supply pipe 291.

For example, an inert gas such as nitrogen ($N_2$) gas may be used as the purge gas.

The gas supplier 290 is constituted mainly by the gas supply pipe 291, the MFC 293 and the valve 294. The MFC 293 and the valve 294 are electrically connected to the controller 310 described later. The gas supplier 290 may also be referred to as a "purge gas supplier 290".

<Exhauster>

An exhaust port 245 is provided on the side wall of the process vessel 202. An inner atmosphere of the process vessel 202 is exhausted through the exhaust port 245. An exhaust pipe 246 is connected to a side surface of an outer wall of the process vessel 202 so as to communicate with the exhaust port 245. A pressure regulator 247 and a vacuum pump 248 are connected at the exhaust pipe 246 in the sequential order from an upstream side to a downstream side of the exhaust pipe 246. For example, an APC (Automatic Pressure Controller) valve configured to control an inner pressure of the process chamber 205 to a predetermined pressure may be used as the pressure regulator 247. An exhauster (which is an exhaust system) is constituted mainly by the exhaust port 245, the exhaust pipe 246 and the pressure regulator 247. The exhauster may further include the vacuum pump 248.

<Controller>

The substrate processing apparatus 200 includes the controller 310 configured to control operations of components constituting the substrate processing apparatus 200. The controller 310 may also be referred to as an "apparatus controller 310".

Figure 3:
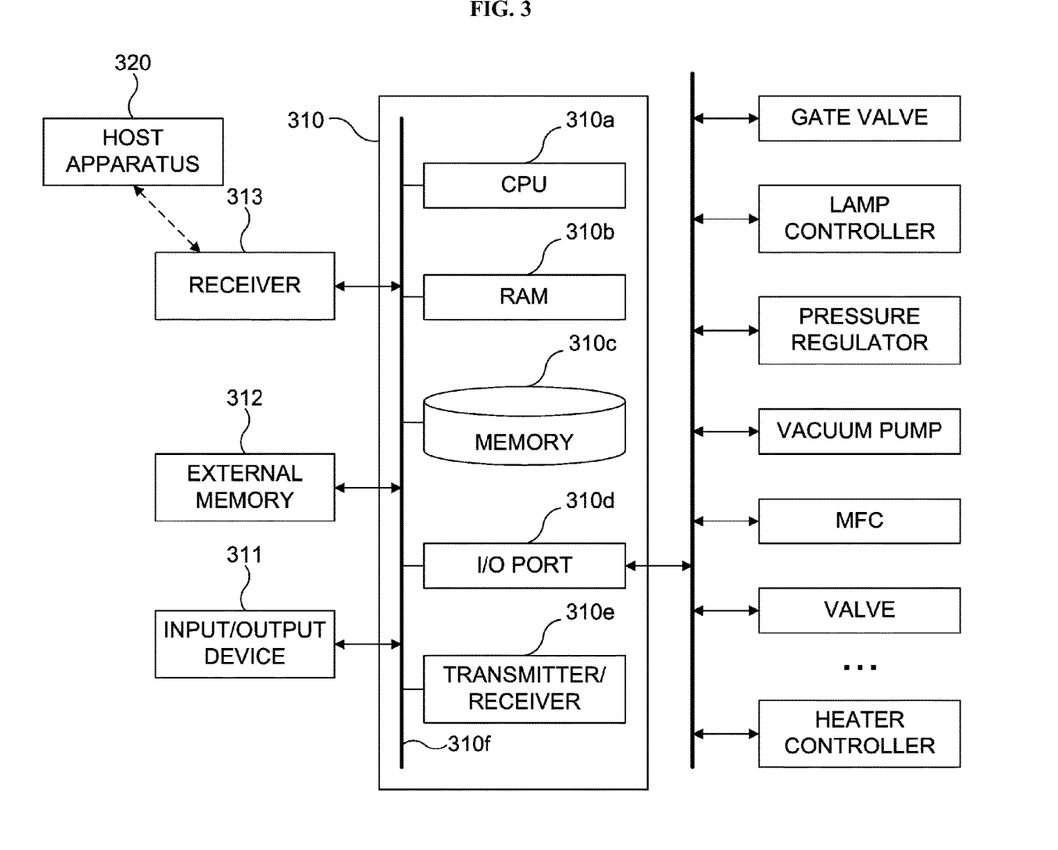
FIG. 3 is a block diagram schematically illustrating a controller and related components of the substrate processing apparatus preferably used in the embodiments described herein.

FIG. 3 is a block diagram schematically illustrating the controller 310 and related components of the substrate processing apparatus 200. The controller 310 serving as a control device (control structure) is embodied by a computer including a CPU (Central Processing Unit) 310a, a RAM (Random Access Memory) 310b, a memory 310c, an I/O port 310d and a transmitter/receiver 310e. The RAM 310b, the memory 310c and the I/O port 310d may exchange data with the CPU 310a through an internal bus 310f. The transmitter/receiver 310e is configured to instruct the components constituting the substrate processing apparatus 200 to transmit and receive data among the components.

For example, an input/output device 311 such as a touch panel (not shown) or an external memory 312 may be connected to the controller 310. Further, a receiver 313 connected to a host apparatus 320 via a network may be provided. The receiver 313 is configured to receive information on other apparatuses from the host apparatus 320.

The memory 310c may be embodied by components such as a flash memory and a HDD (Hard Disk Drive). Data such as a control program configured to control the operation of the substrate processing apparatus 200 and a process recipe in which information such as the order and the conditions of a substrate processing described later is stored may be readably stored in the memory 310c. The process recipe is obtained by combining steps of the substrate processing described later such that the controller 310 can execute the steps to acquire a predetermine result, and functions as a program. Hereinafter, the process recipe and the control program may be collectively or individually referred to as a "program". In the present specification, the term "program" may indicate only the process recipe, may indicate only the control program, or may indicate both of the process recipe and the control program. The RAM 310b functions as a memory area (work area) where a program or data read by the CPU 310a is temporarily stored.

The I/O port 310d is electrically connected to the components of the substrate processing apparatus 200 such as the gate valve 204, the elevator 218, the heater controller 220, the lamp controller 263 and the pressure regulator 247.

The CPU 310a is configured to read the control program from the memory 310c and execute the read control program. Furthermore, the CPU 310a is configured to read the process recipe from the memory 310c according to an operation command inputted from the input/output device 311. According to the contents of the read recipe, the CPU 310a may be configured to control various operations such as an opening/closing operation of the gate valve 204, an operation of the elevator 218, an operation of the heater controller 220, an operation of the lamp controller 263 and a pressure regulating operation (pressure adjusting operation) of the pressure regulator 247.

The controller 310 may be embodied by a dedicated computer or by a general-purpose computer. For example, the controller 310 may be embodied by preparing the external memory 312 storing the program described above and by installing the program onto the general-purpose computer using the external memory 312. For example, the external memory 312 may include a magnetic tape, a magnetic disk such as a flexible disk and a hard disk, an optical disk such as a CD and a DVD, a magneto-optical disk such as an MO and a semiconductor memory such as a USB memory and a memory card. The means for providing the program to the computer is not limited to the external memory 312. For example, the program may be supplied to the computer (general-purpose computer) using communication means such as the Internet and a dedicated line. In addition, the memory 310c or the external memory 312 may be embodied by a non-transitory computer readable recording medium. Hereafter, the memory 310c and the external memory 312 may be collectively or individually referred to as the recording medium. In the present specification, the term "recording medium" may refer to only the memory 310c, may refer to only the external memory 312 or may refer to both of the memory 310c and the external memory 312.

(2) Description of Semiconductor Device

Figure 4:
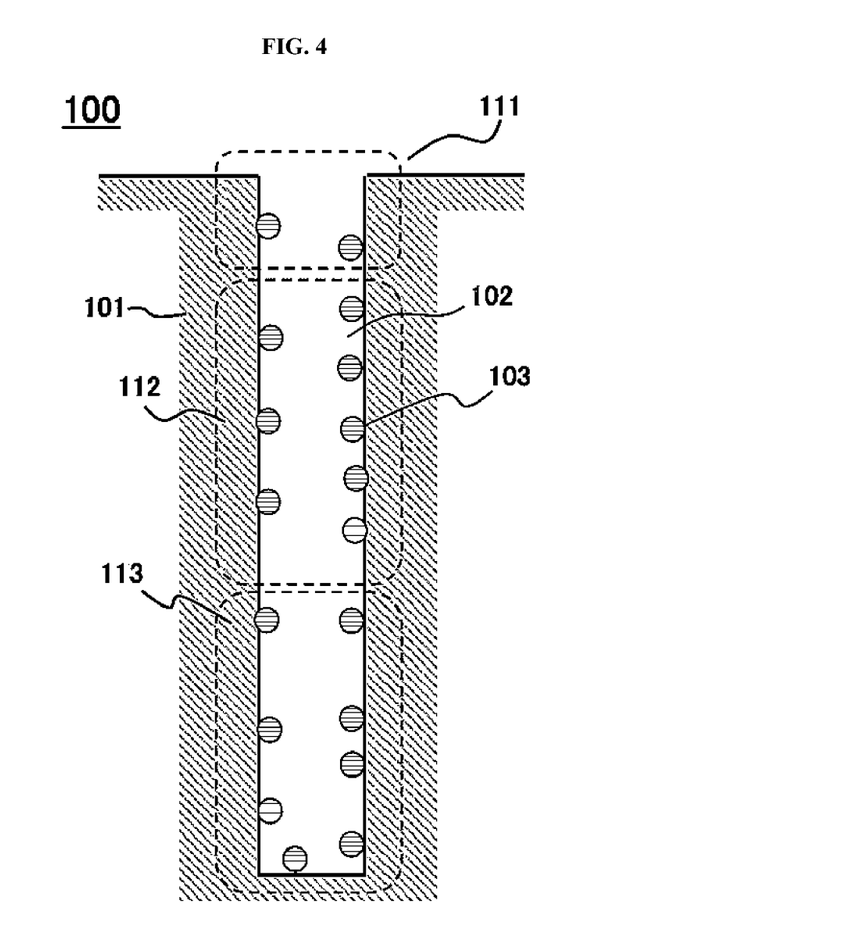
FIG. 4 schematically illustrates a processing state of a wafer to be processed according to the embodiments described herein.

Subsequently, an example of a semiconductor device to be processed will be described with reference to FIG. 4. In FIG. 4, a reference numeral 101 denotes a film formed on the wafer 100. For example, the film 101 may be constituted by at least one selected from the group comprising a silicon oxide film, a silicon nitride film and a metal film. A reference numeral 102 denotes a plurality of grooves (hereinafter, also simply referred to as grooves) whose aspect ratio is high. A reference numeral 111 denotes an upper region of the grooves 102. A reference numeral 113 denotes a lower region of the grooves 102. A reference numeral 112 denotes a central region of the grooves 102 between the upper region 111 and the lower region 113.

The grooves 102 are formed by an etching process (also referred to as an "etching step") performed in advance. In the etching process, for example, an etching gas containing carbon (C), fluorine (F) and argon (Ar) may be used to form the grooves 102. In the etching process, for example, the grooves 102 are mainly formed by argon components and fluorine components contained in the etching gas, and the film 101 surrounding the grooves 102 is protected by carbon components contained in the etching gas.

A residue of the film 101 remaining in the grooves 102 in the etching process, a residue of the etching gas in the etching process, a protective film containing the carbon components and the like may be removed in the subsequent cleaning process (also referred to as a "cleaning step"). A water-soluble cleaning liquid may be used in the cleaning process. It is possible to remove most of the residues and the protective film by performing the cleaning process. However, in some cases, it may not be possible to remove some of the residues and some of the protective film. In addition, an OH group, which is a residue of the cleaning liquid, may adhere to surfaces of the grooves 102. In the present specification, for convenience of explanation, the residues in the etching process, the residue of the protective film and the residue of the cleaning liquid may be collectively or individually referred to as a residue (also referred to as a "residual component")103.

Subsequently, the concerns regarding a case where a new film is formed on the surfaces of the grooves 102 shown in FIG. 4 will be described. In such a case, the residue 103 may be present between the new film and the film 101. For example, the characteristics of the new film may change depending on the presence or absence of the residue 103, and a uniformity of the characteristics of the new film may be impaired. When an insulating film is formed as the new film, a uniformity of a resistance value of the new film may be impaired. For example, the resistance value of the new film in a location where the OH group exists may be higher than in a location where the OH group does not exist.

Therefore, according to the present embodiments, the residue 103 in the grooves 102 is reliably discharged from the grooves 102 shown in FIG. 4.

(3) Substrate Processing

Figure 5:
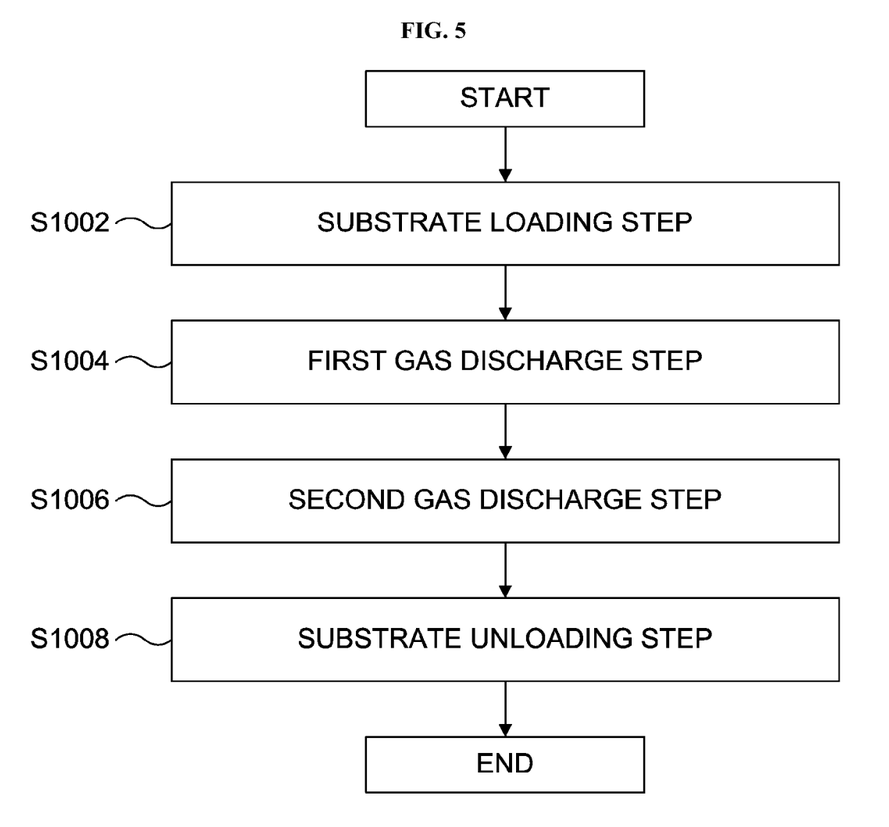
FIG. 5 is a flowchart schematically illustrating a substrate processing according to the embodiments described herein.
Figure 6:
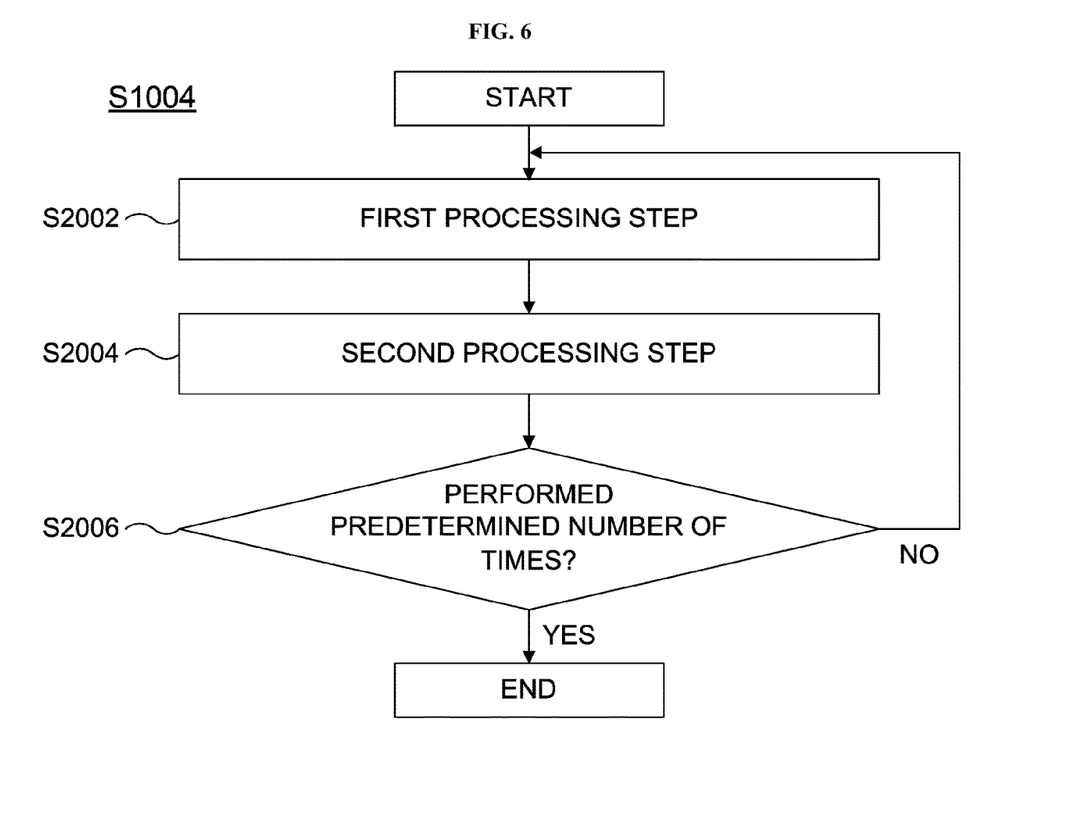
FIG. 6 is a flowchart schematically illustrating a first gas discharge step of the substrate processing according to the embodiments described herein.
Figure 7:
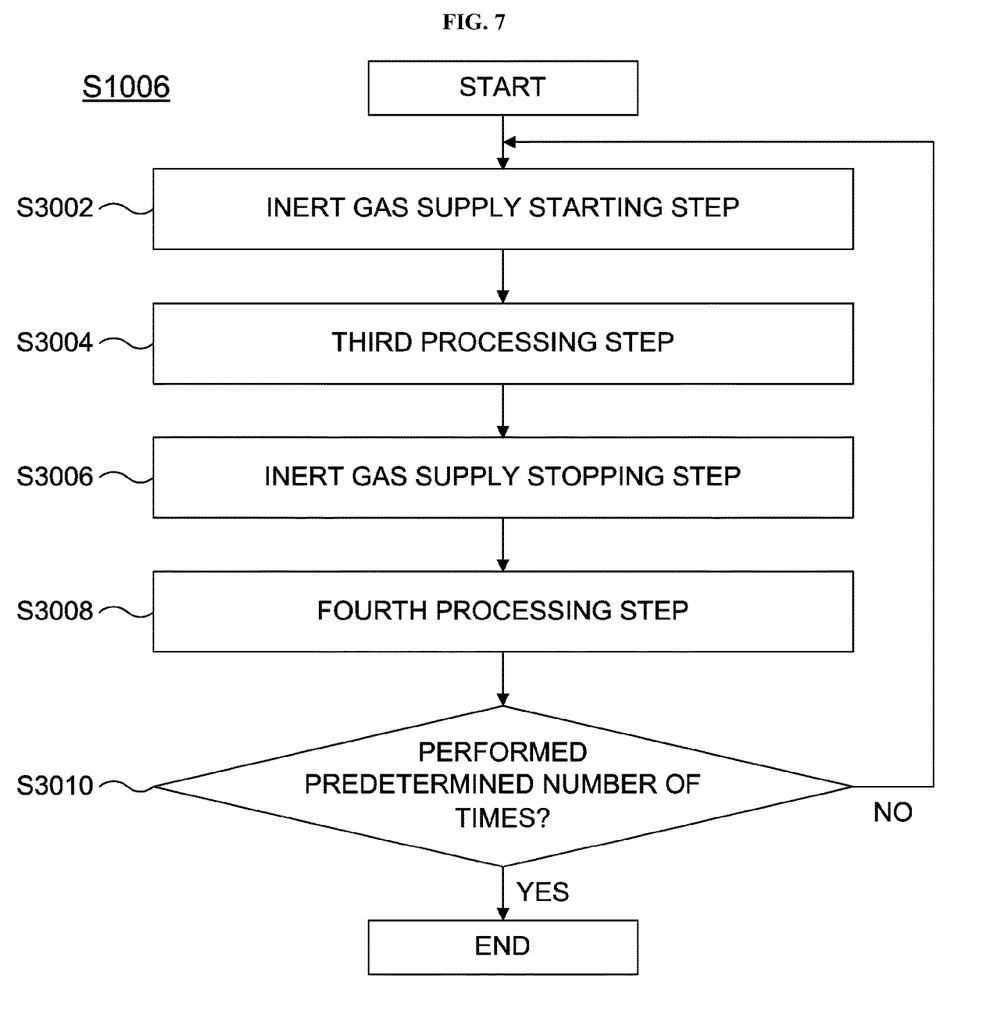
FIG. 7 is a flowchart schematically illustrating a second gas discharge step of the substrate processing according to the embodiments described herein.

Subsequently, the substrate processing will be described. That is, the substrate processing of discharging the residue 103 from the grooves 102 of the wafer 100 using the substrate processing apparatus 200 will be described with reference to FIGS. 5 through 7. FIG. 5 is a flowchart schematically illustrating an exemplary sequence of the substrate processing according to the present embodiments. FIG. 6 is a flowchart schematically illustrating a detailed flow of a first gas discharge step S1004 shown in FIG. 5. FIG. 7 is a flowchart schematically illustrating a detailed flow of a second gas discharge step S1006 shown in FIG. 5. FIGS. 8A through 9D schematically illustrate processing states of the wafer 100 processed according to the present embodiments. That is, FIGS. 8A through 9D schematically illustrate relationships between the grooves 102 and the residue 103 in the substrate processing. In the following description, the operations of the components constituting the substrate processing apparatus 200 are controlled by the controller 310.

<Substrate Loading Step S1002>

The substrate loading step S1002 will be described. In the substrate processing apparatus 200, the substrate mounting stage 212 is lowered to face the substrate loading/unloading port 203. Subsequently, the gate valve 204 is opened, and the wafer 100 is transferred into the process chamber 205 using a wafer transfer device (not shown). Then, the wafer 100 is transferred onto the substrate mounting stage 212. As a result, the wafer 100 is supported on the substrate mounting stage 212 in a horizontal orientation.

After the wafer 100 is transferred into the process vessel 202, the wafer transfer device is retracted to the outside of the process vessel 202, and the gate valve 204 is closed to seal (close) the inside of the process vessel 202.

<First Gas Discharge Step S1004>

Figure 8A:
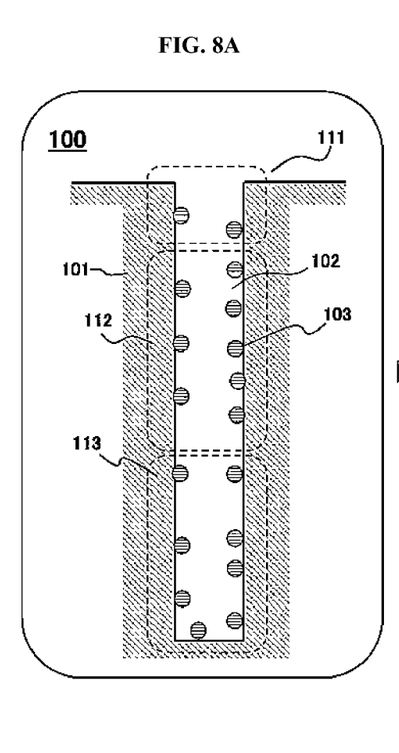
FIG. 8A through 8C schematically illustrate processing states of the wafer processed according to the embodiments described herein.
Figure 8B:
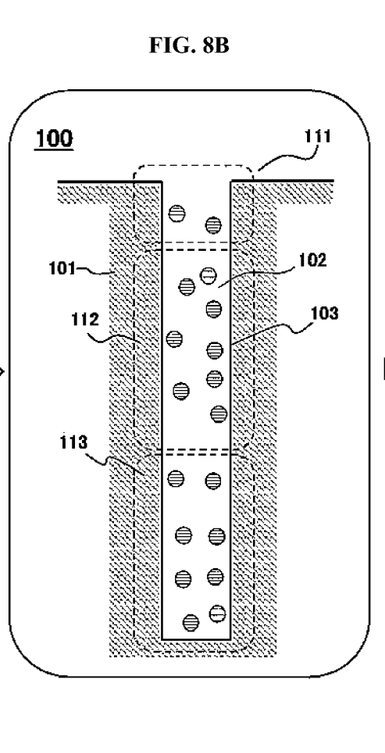
Figure 8C:
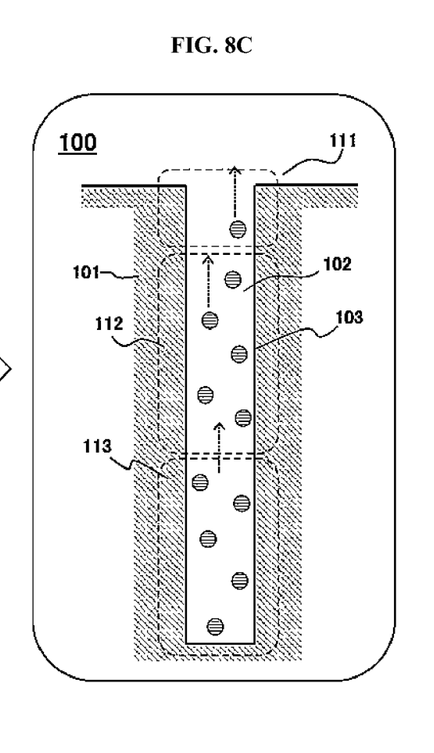

The first gas discharge step S1004 will be described in detail with reference to FIG. 6 and FIGS. 8A through 8C. FIG. 8A schematically illustrates the processing state of the wafer 100 transferred into the process vessel 202. The processing state of the wafer 100 shown in FIG. 8A is the same as that of the wafer 100 shown in FIG. 4. FIG. 8B schematically illustrates the processing state of the wafer 100 after a first processing step S2002 described later is performed on the wafer 100 shown in FIG. 8A. FIG. 8C schematically illustrates the processing state of the wafer 100 after a second processing step S2004 described later is performed on the wafer 100 shown in FIG. 8B. In the first gas discharge step S1004, the exhauster is controlled to maintain the inner pressure of the process chamber 205 to a predetermined pressure.

<First Processing Step S2002>

The first processing step S2002 will be described. In the first processing step S2002, first, the heater 213 regulates (or adjusts) a temperature of the wafer 100. Specifically, the wafer 100 is heated to a first temperature by the heater 213 which has been heated to a predetermined temperature in advance. For example, the temperature of the wafer 100 is elevated to 400° C. When the wafer 100 reaches the predetermined temperature described above, the heater 213 continuously heats the wafer 100 for a predetermined time. In the first processing step S2002, the plurality of the lamps 261 are turned off (that is, the plurality of the lamps 261 are not operated), and the valve 294 is closed.

For example, the first temperature refers to a temperature at which the residue 103 can be desorbed from the surfaces of the grooves 102. Therefore, when the wafer 100 is heated to the first temperature in the first processing step S2002, the residue 103 is desorbed from the surfaces of the grooves 102 as shown in FIG. 8B.

<Second Processing Step S2004>

The second processing step S2004 will be described. In the second processing step S2004, subsequently, the heater 213 continuously heats the wafer 100. In parallel with heating the wafer 100 by the heater 213, the plurality of the lamps 261 are turned on and the plurality of the lamps 261 are operated. By turning on the plurality of the lamps 261, the temperature of the wafer 100 on a side facing the plurality of the lamps 261 is heated to a second temperature higher than the first temperature. For example, the second temperature is set to 900° C. In the second processing step S2004, the valve 294 is continuously closed.

The wafer 100 is subject to irradiation from the plurality of the lamps 261 in a short time. An irradiation time is set to a time duration such that a temperature of the upper region 111 is higher than that of the lower region 113. That is, the irradiation time is set such that the temperature of the wafer 100 gradually increases from the lower region 113 to the upper region 111 of the grooves 102. In other words, the irradiation time is set such that the temperature of the upper region 111 is different from that of the lower region 113. In addition, the irradiation time is set such that the temperature of the wafer 100 does not adversely affect the film provided on the wafer 100.

Subsequently, the reasons for setting the temperature of the upper region 111 to be higher than that of the lower region 113 will be described.

First, comparative examples will be described. Here, a first comparative example will be described. As a method of discharging the residue 103 from the grooves 102, for example, the purge gas may be supplied into the process chamber 205 to push out and discharge the residue 103 from the grooves 102. However, since the purge gas that is about to enter the grooves 102 exists between the process space 201 and the residue 103, the residue 103 is prevented from moving from the grooves 102 to the process space 201. Therefore, the residue 103 may remain in the grooves 102. As a result, the residue 103 may not be discharged from the grooves 102.

Subsequently, a second comparative example will be described. As a method of discharging the residue 103 from the grooves 102, for example, a pressure of the process space 201 may be further reduced to draw out (or discharge) the residue 103 from the grooves 102. However, since it takes time to discharge the residue 103 from the grooves 102, the throughput may decrease.

Therefore, in the second processing step S2004, the valve 294 is closed so as not to supply the purge gas. Since molecules move from a lower temperature portion to a higher temperature portion in a low pressure state, the plurality of the lamps 261 are turned on to elevate the temperature of the upper region 111 higher than the temperature of the lower region 113 so as to promote the movement of the molecules. That is, as shown in FIG. 8C, the residue 103 is discharged from the grooves 102 into the process space 201.

As is generally known, the molecules move without colliding with other molecules in a Knudsen diffusion region of high diffusivity. That is, according to the present embodiments, the pressure of the process space 201 may be set to a low pressure so that the Knudsen diffusion region can be formed. In such a case, the desorbed residue moves without colliding with other residues so that it can further promote the discharge of the residue 103.

Since the temperature of the wafer 100 gradually increases from the lower region 113 to the upper region 111 via the central region 112, the residue 103 is smoothly moved from the lower region 113 to the upper region 111, and the residue 103 in a region such as the central region 112 does not interfere with the movement of the residue 103 in a region such as the lower region 113.

After a predetermined time has elapsed, the plurality of the lamps 261 are turned off. For example, the predetermined time refers to a time duration during which the temperature of the upper region 111 is higher than that of the central region 112 and the temperature of the central region 112 is higher than that of the lower region 113.

<Determination Step S2006>

The determination step S2006 will be described. The controller 310 determines whether a cycle including the first processing step S2002 and the second processing step S2004 has been performed a predetermined number of times (n times).

When the controller 310 determines, in the determination step S2006, that the cycle has not been performed the predetermined number of times (n times) ("NO" in the step S2006 shown in FIG. 6), the cycle including the first processing step S2002 and the second processing step S2004 is performed again. By repeatedly performing the cycle, it is possible to reduce the residue 103 in the grooves 102.

When the second processing step S2004 is completed, the plurality of the lamps 261 are turned off. Since the plurality of the lamps 261 are turned off, it is possible to lower a thermal budget of the wafer 100 when shifting to the first processing step S2002 after the second processing step S2004 is completed. In particular, since the plurality of the lamps 261 can be easily switched on and off, it is possible to immediately reduce the heat effect. Therefore, when the plurality of the lamps 261 are used as the second heater, it is possible to facilitate the control according to the first gas discharge step S1004, and it is also possible to easily lower the thermal budget of the wafer 100.

Since it is possible to facilitate the control according to the first gas discharge step S1004, it is possible to process the wafer 100 based on a heat resistance of the film formed on the wafer 100. That is, when processing the wafer 100 including a film whose heat resistance is high, by lengthening a process time of the second processing step S2004, it is possible to discharge the residue 103 by performing the cycle only a small number of times (that is, n is small). As a result, it is possible to improve the throughput.

When processing the wafer 100 including a film whose heat resistance is low, the predetermined number of times (n times) of performing the cycle may be increased. In such a case, since the number of transitions from the second processing step S2004 to the first processing step S2002 is increased, it is possible to reduce the thermal budget. Therefore, it is possible to discharge the residue 103 without deteriorating the characteristics of the film whose heat resistance is low.

In addition, when processing the wafer 100 including the film whose heat resistance is low, the process time of the second processing step S2004 may be shortened. As a result, it is possible to avoid the accumulation of the thermal budget.

When the controller 310 determines, in the determination step S2006, that the cycle has been performed the predetermined number of times (n times) ("YES" in the step S2006 shown in FIG. 6), the steps (that is, the first gas discharge step S1004) shown in FIG. 6 is terminated.

<Second Gas Discharge Step S1006>

Subsequently, the second gas discharge step S1006 will be described. Even when the residue 103 is desorbed in the first gas discharge step S1004 and many OH groups are discharged from the grooves 102, the residue 103 may still remain in the grooves 102. In case of miniaturized fabrication, even a small amount of the residue 103 can adversely affect the uniformity. As a result, a desired device performance may not be obtained. Considering this, in the second gas discharge step S1006, the residue 103 of the first gas discharge step S1004 is more reliably discharged.

Figure 9A:
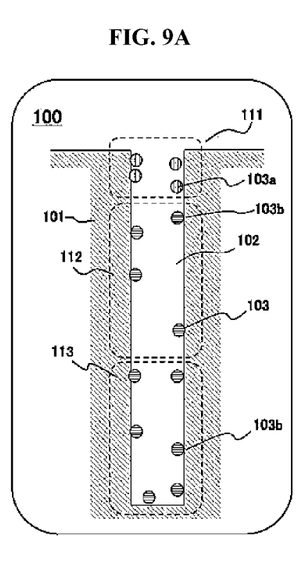
FIG. 9A through 9D schematically illustrate processing states of the wafer processed according to the embodiments described herein.
Figure 9B:
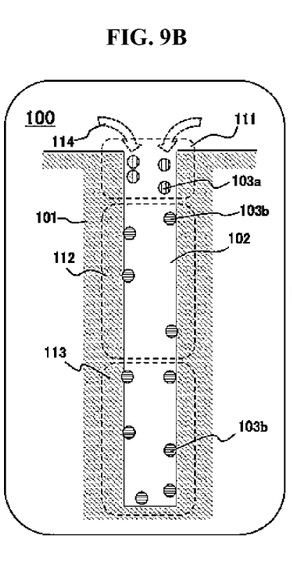
Figure 9C:
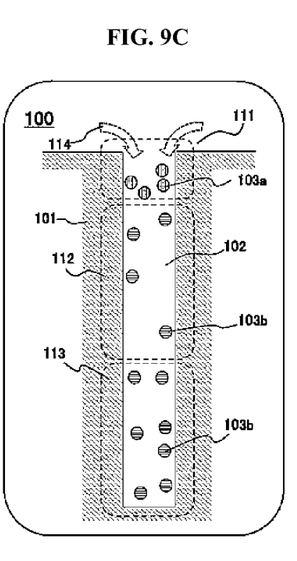
Figure 9D:
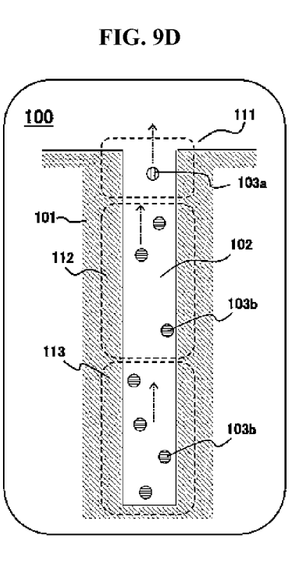

The second gas discharge step S1006 will be described in detail with reference to FIG. 7 and FIGS. 9A through 9D. FIG. 9A schematically illustrates the processing state of the wafer 100 after the second processing step S2004 is performed. FIG. 9B schematically illustrates the processing state of the wafer 100 in an inert gas supply starting step S3002 described later. FIG. 9C schematically illustrates the processing state of the wafer 100 after a third processing step S3004 described later is performed. FIG. 9D schematically illustrates the processing state of the wafer 100 after a fourth processing step S3008 described later is performed.

<Inert Gas Supply Starting Step S3002>

The inert gas supply starting step S3002 will be described. In the grooves 102 of the wafer 100 processed in the first gas discharge step S1004, as shown in FIG. 9A for example, the residue 103 that failed to be discharged in the first gas discharge step S1004 may remain. In particular, in the upper region 111, a residue 103a once desorbed from the central region 112 or the lower region 113 may be adhered again to the surfaces of the grooves 102. The re-adhered residue 103a solidifies in the upper region 111 to be adhered thereto. In such a case, the adhesion strength of the re-adhered residue 103a is higher than that of the residue 103 in other locations. In addition, a residue 103b remains in each region. An arrow 114 indicates a flow of the inert gas.

In the inert gas supply starting step S3002, by opening the valve 294, the inert gas 114 is supplied to the wafer 100 whose processing state is shown in FIG. 9A in the process chamber 205. As described in FIG. 9B, the inert gas physically contacts the re-adhered residue 103a and desorbs the residue 103a from the surfaces of the grooves 102. In the inert gas supply starting step S3002, the heater 213 is turned on and the plurality of the lamps 261 are turned off.

<Third Processing Step S3004>

Subsequently, the third processing step S3004 will be described. In the third processing step S3004, the inert gas is continuously supplied, and the wafer 100 is heated for a predetermined time in the same manner as in the first processing step S2002. By processing the wafer 100 in the third processing step S3004, the residue 103b is desorbed from the surfaces of the grooves 102 as shown in FIG. 9C. The residue 103a whose adhesion strength is high is desorbed by the inert gas as described above. In addition, the residue 103b remaining in each region is desorbed from the surfaces of the grooves 102 by the heat.

The temperature of the wafer 100 is set to a third temperature. For example, the third temperature refers to a temperature at which the residue 103 can be desorbed from the surfaces of the grooves 102. The third temperature may be about 400° C., which is equivalent to the first temperature, or may be different from the first temperature as long as the residue 103 can be desorbed from the surfaces of the grooves 102. In the third processing step S3004, the heater 213 is kept in turned-on state and the plurality of the lamps 261 are kept in turned-off state.

<Inert Gas Supply Stopping Step S3006>

Subsequently, the inert gas supply stopping step S3006 will be described. After continuously performing the third processing step S3004 for a predetermined time, the valve 294 is closed to stop the supply of the inert gas.

<Fourth Processing Step S3008>

Subsequently, the fourth processing step S3008 will be described. The fourth processing step S3008 is similar to the second processing step S2004, and the heater 213 continuously heats the wafer 100. In parallel with heating the wafer 100 by the heater 213, the plurality of the lamps 261 are turned on. By turning on the plurality of the lamps 261, the temperature of the wafer 100 on the side facing the plurality of the lamps 261 is heated to a fourth temperature higher than the third temperature.

In the fourth processing step S3008, the heater 213 and the plurality of the lamps 261 heat the wafer 100 such that a temperature of the surface of the wafer 100 reaches to the fourth temperature. For example, the fourth temperature may be a temperature higher than the third temperature, or may be the same temperature as the second temperature or else.

The wafer 100 is subject to irradiation from the plurality of the lamps 261 in a short time. An irradiation time in the fourth processing step S3008 is set to a time duration such that the temperature of the upper region 111 is higher than that of the lower region 113. That is, the irradiation time in the fourth processing step S3008 is set such that the temperature of the wafer 100 gradually increases from the lower region 113 to the upper region 111 of the grooves 102. In addition, the irradiation time in the fourth processing step S3008 is set such that the temperature of the wafer 100 does not adversely affect the film provided on the wafer 100.

The residue 103 in the grooves 102 is discharged from the grooves 102 in the same manner as in the second processing step S2004. In the fourth processing step S3008, the valve 294 is closed.

<Determination Step S3010>

Subsequently, the determination step S3010 will be described. The controller 310 determines whether a cycle including the inert gas supply starting step S3002 through the fourth processing step S3008 has been performed a predetermined number of times (m times).

When the controller 310 determines, in the determination step S3010, that the cycle has not been performed the predetermined number of times (m times) ("NO" in the step S3010 shown in FIG. 7), the cycle including the inert gas supply starting step S3002 through the fourth processing step S3008 is performed again. By repeatedly performing the cycle, it is possible to more reliably reduce the residue 103 in the grooves 102.

When the fourth processing step S3008 is completed, the plurality of the lamps 261 are turned off. Since the plurality of the lamps 261 are turned off, it is possible to lower a thermal budget of the wafer 100 when shifting to the inert gas supply starting step S3002 after the fourth processing step S3008 is completed. Therefore, it is possible to process the wafer 100 according to the heat resistance of the film formed on the wafer 100.

That is, when processing the wafer 100 including the film whose heat resistance is high, by lengthening a process time of the fourth processing step S3008, it is possible to discharge the residue 103 by performing the cycle only a small number of times (that is, m is small). As a result, it is possible to improve the throughput.

When processing the wafer 100 including the film whose heat resistance is low, the predetermined number of times (m times) of performing the cycle may be increased. In such a case, since the number of transitions from the fourth processing step S3008 to the inert gas supply starting step S3002 is increased, it is possible to reduce the thermal budget. Therefore, it is possible to discharge the residue 103 without deteriorating the characteristics of the film whose heat resistance is low.

In addition, when processing the wafer 100 including the film whose heat resistance is low, the process time of the fourth processing step S3008 may be shortened. As a result, it is possible to avoid the accumulation of the thermal budget.

When the controller 310 determines, in the determination step S3010, that the cycle has been performed the predetermined number of times (m times) ("YES" in the step S3010 shown in FIG. 7), the steps (that is, the second gas discharge step S1006) shown in FIG. 7 is terminated.

<Substrate Unloading Step S1008>

When the wafer 100 is lowered to face the substrate loading/unloading port 203, the wafer 100 is transferred out of the substrate processing apparatus 200 in the order reverse to that of the substrate loading step S1002 by controlling the components constituting the substrate processing apparatus 200.

Other Embodiments

While the technique is described in detail by way of the above-described embodiments, the above-described technique is not limited thereto. The above-described technique may be modified in various ways without departing from the gist thereof.

For example, while the above-described embodiments are described by way of an example in which the OH groups or the carbon components are used as the residue, the above-described technique is not limited thereto. For example, any material that deteriorates the characteristics of the film may be used as the residue.

In addition, while the above-described embodiments are described by way of an example in which the plurality of the lamps 261 are used as a structure of heating the surface of the wafer 100, the above-described technique is not limited thereto. For example, the structure is not limited to the plurality of the lamps 261 as long as the surface of the wafer 100 can be heated. For example, a microwave generator may be used as the second heater, and the surface of the wafer 100 may be may be heated by irradiating the surface of the wafer 100 with microwaves from the microwave generator.

According to some embodiments of the technique in the present disclosure, it is possible to form the film with uniform characteristics are uniform by discharging the residual component in the grooves before supplying the process gas.

What is claimed is:

1. A method of manufacturing a semiconductor device comprising:
   (a) loading a substrate on which a plurality of grooves are provided into a process chamber, wherein a residue is adhered to the plurality of the grooves;
   (b) desorbing the residue from the plurality of the grooves by heating the substrate; and
   (c) discharging the residue from the plurality of the grooves to a process space of the process chamber after (b) is performed by heating a surface of the substrate to a temperature higher than a temperature of the substrate in (b) such that a temperature of an upper region of the plurality of the grooves is higher than a temperature of a lower region of the plurality of the grooves,
   wherein a first heater configured to heat the substrate through a back surface of the substrate and a second heater configured to heat the substrate through the surface of the substrate are provided in the process chamber, and
   wherein the first heater is operated without operating the second heater in (b), and the second heater and the first heater are operated in (c).

2. The method of claim 1, wherein (b) and (c) are performed a predetermined number of times.

3. The method of claim 1, further comprising
   (d) supplying an inert gas into the process chamber after (c) is performed.

4. The method of claim 3, further comprising
   (e) heating the surface of the substrate to a first temperature while (d) is performed; and
   (f) heating the surface of the substrate to a second temperature higher than the first temperature after (d) is performed.

5. The method of claim 4, wherein the surface of the substrate is heated in (e) such that the temperature of the upper region of the plurality of the grooves is higher than the temperature of the lower region of the plurality of the grooves.

6. The method of claim 5, wherein the first heater is operated without operating the second heater in (d), and the second heater and the first heater are operated in (e).

7. The method of claim 6, wherein (d) and (e) are performed a predetermined number of times.

8. The method of claim 4, wherein a supply of the inert gas is stopped in (e).

9. The method of claim 8, wherein the first heater is operated without operating the second heater in (d), and the second heater and the first heater are operated in (e).

10. The method of claim 9, wherein (d) and (e) are performed a predetermined number of times.

11. The method of claim 4, wherein the first heater is operated without operating the second heater in (d), and the second heater and the first heater are operated in (e).

12. The method of claim 11, wherein (d) and (e) are performed a predetermined number of times.

13. The method of claim 4, wherein (d) and (e) are performed a predetermined number of times.

14. A non-transitory computer-readable recording medium storing a program that causes a substrate processing apparatus, by a computer, to perform the method of claim 1.

* * * * *